United States Patent [19]

Nozaki et al.

[11] Patent Number: 4,733,746
[45] Date of Patent: Mar. 29, 1988

[54] VACUUM TREATING METHOD AND APPARATUS

[75] Inventors: Hiroyoshi Nozaki, Sayama; Hiroo Ebisawa, Iruma; Hirofumi Hara, Hino, all of Japan

[73] Assignee: Honda Giken Kogyo Kabushiki Kaisha, Tokyo, Japan

[21] Appl. No.: 874,934

[22] Filed: Jun. 16, 1986

[30] Foreign Application Priority Data

Jun. 17, 1985 [JP] Japan .................. 60-131528
Jun. 17, 1985 [JP] Japan .................. 60-131529

[51] Int. Cl.$^4$ ............... B05C 11/00; C23C 14/00; B01J 19/08; B01J 19/12
[52] U.S. Cl. ................... 118/50.1; 118/663; 422/186.05; 422/186.29; 427/294
[58] Field of Search ........ 118/676, 704, 719, 50, 118/50.1, 663; 427/294–298, 350, 351, 45.1, 46; 422/186.05, 186.29

[56] References Cited

U.S. PATENT DOCUMENTS

4,551,310 11/1985 Imada et al. ............ 422/186.05
4,579,623 4/1986 Suzuki et al. ............ 118/50.1 X

FOREIGN PATENT DOCUMENTS

1189714 4/1970 United Kingdom .

*Primary Examiner*—Michael R. Lusignan
*Attorney, Agent, or Firm*—Armstrong, Nikaido, Marmelstein & Kubovcik

[57] ABSTRACT

A vacuum treating method and apparatus wherein preliminary vacuum chambers which are charged with and discharged therefrom materials to be treated are arranged on both sides of a vacuum treating chamber such that the preliminary vacuum chambers are switchingly communicated with and disconnected from the vacuum treating chamber; the materials are alternately moved between both the preliminary vacuum chambers and the vacuum treating chamber and are subject to vacuum treatment for a predetermined period of time in the vacuum treatment for a predetermined period of time in the vacuum treating chamber; wherein when a material to be treated has been charged from one preliminary vacuum chamber to the vacuum treating chamber and a treated materiala has been discharged from the vacuum treating chamber to the other preliminary chamber, the vacuum treating chamber and both the preliminary vacuum chambers are disconnected from each other, then the pressure within the vacuum treating chamber is reduced to a required degree of vacuum and the pressure with the one preliminary vacuum chamber is reduced to a degree of vacuum higher than that required for vacuum treatment, and in the other preliminary vacuum chamber, after a treated material has been discharged out and a new material to be treated has been charged, the pressure reduction is initiated from an atmospheric state; and wherein after vacuum treatment has been made in the vacuum treating chamber, the vacuum treating chamber and both the preliminary vacuum chambers are brought into communication with each other to move the materials therebetween.

4 Claims, 5 Drawing Figures

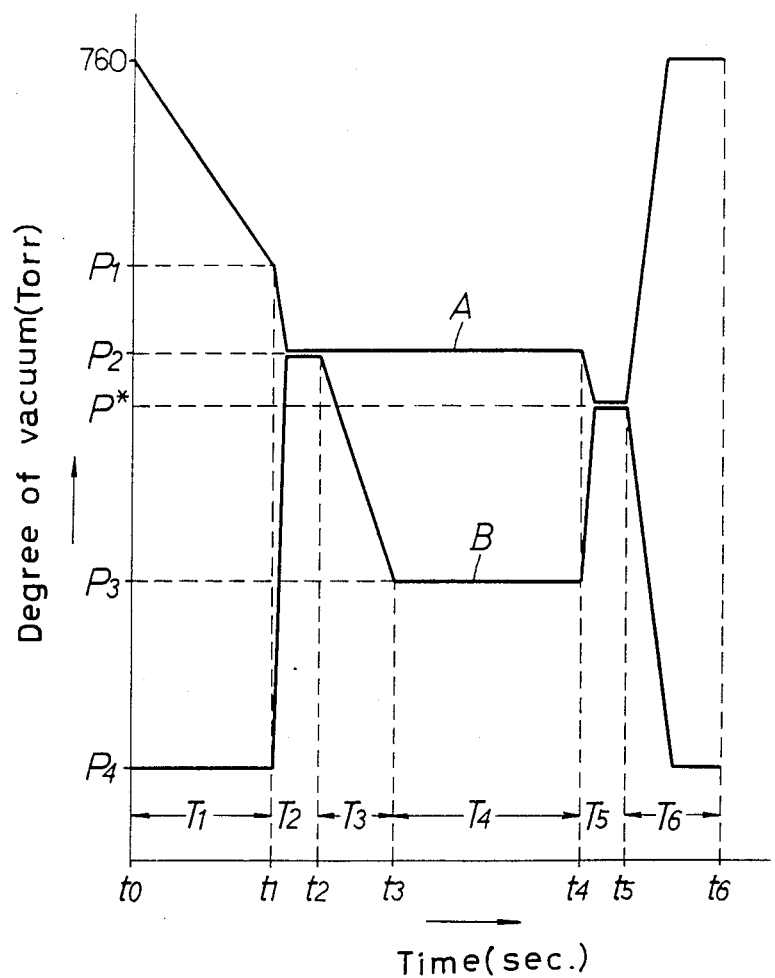

VACUUM TREATING METHOD AND APPARATUS

BACKGROUND OF THE INVENTION

1. Field of the Invention

The present invention relates to a vacuum treating method and apparatus.

2. Description of the Prior Art

In the past, as a treating method used on plastic products prior to coating, it has been known, for example, in Japanese Patent Application Laid-Open No. 141340/1979 and the like, to apply a low temperature plasma treatment using oxygen gases under a high vacuum atmosphere, 0.1 to 5 Torr.

In the above-described prior art, a first exhaust chamber, a vacuum chamber and a second exhaust chamber are arranged in order, and when a material to be treated is moved from the first exhaust chamber to the vacuum chamber, the first exhaust chamber is reduced in pressure from atmospheric pressure to that degree of vacuum which is suitable for treatment thereby to have degrees of vacuum of the first exhaust chamber and vacuum chamber equalized with each other, after which the first exhaust chamber and vacuum chamber are brought into communication with each other and the material is moved. Therefore, where a material or article to be treated is large in size for example such as a bumper of an automobile, there have been encountered inconveniences in that an increase in volume of the first exhaust chamber and vacuum chamber is followed by an aspirator or suction means for obtaining a predetermined degree of vacuum becoming large-sized, an operating cost increasing, and preparatory time prior to treatment work becoming lengthy, resulting in the lowering of productivity.

SUMMARY OF THE INVENTION

It is an object of the present invention to provide a vacuum treating method and apparatus which can provide a high degree of vacuum without increasing the size of the aspirator, and which can increase the productivity and reduce the operating cost.

For achieving the above-described object, according to the present invention, there is provided a vacuum treating method in a device having preliminary vacuum chambers capable of being charged with and discharging therefrom materials to be treated on both sides of a vacuum treating chamber so that the preliminary vacuum chambers are switchable to be communicated with and disconnected from the vacuum treating chamber, the method comprising the steps of moving the materials to be treated alternately between one of the preliminary vacuum chambers and the vacuum treating chamber and between the other preliminary chamber and the vacuum treating chamber thereby to subject the materials to vacuum treatment for a predetermine period of time in the vacuum treating chamber; reducing a pressure within the vacuum treating chamber to a required degree of vacuum after the communication between the vacuum treating chamber and the preliminary vacuum chambers is cut off, when a material to be treated has been charged from one of the preliminary vacuum chambers into the vacuum treating chamber and a treated material has been discharged from the vacuum treating chamber to the other preliminary vacuum chamber; reducing a pressure within the one of the preliminary vacuum chambers to a degree of vacuum higher than that required for vacuum treatment; in the other preliminary vacuum chamber, initiating pressure reduction from an atmospheric state after the treated material has been discharged out and a new material to be treated has been charged; and after conducting vacuum treatment in the vacuum treating chamber, bringing the vacuum treating chamber and both the preliminary vacuum chambers into communication with each other to move the materials therebetween.

According to the present invention, there is provided a vacuum treating apparatus comprising a vacuum treating chamber; a pair of preliminary vacuum chambers capable of being charged with and discharging therefrom materials to be treated and being arranged on opposite sides of the vacuum treating chamber; a pair of shutters disposed between the vacuum treating chamber and both the preliminary vacuum chambers so as to switch communication and disconnection between the vacuum treating chamber and both the preliminary vacuum chambers; a pair of transfer means disposed to extend between both the preliminary vacuum chambers and the vacuum treating chamber so as to alternately move the materials between both the preliminary vacuum chambers and the vacuum treating chamber; suction means connected in common to the vacuum treating chamber and both the preliminary vacuum chambers through respective switching valves; and control means for controlling operations of said shutters, transfer means, suction means and switching valves; said control means being adapted to control said shutters, transfer means, suction means and switching valves such that when the material is under vacuum treatment within the vacuum treating chamber, the pressure of one of the preliminary vacuum chambers which waits in a vacant state for the material under treatment is reduced to a degree of vacuum higher than that required for vacuum treatment whereas the other preliminary vacuum chamber which receives a new material to be treated is reduced its pressure from atmospheric pressure, and after termination of the vacuum treatment, the vacuum treating chamber and both the preliminary vacuum chambers are brought into communication with each other for conducting shifting of materials therebetween.

Owing to the above-described method, while the vacuum treatment is being effected within the vacuum treating chamber, the interior of the preliminary vacuum chamber which remains vacant with the associated material having been moved into the vacuum treating chamber is reduced in pressure to a degree of vacuum higher than that required for vacuum treatment whereas the preliminary vacuum chamber which has newly been charged with a material to be treated is being reduced from atmospheric pressure. Then the vacuum treating chamber and both the preliminary vacuum chambers are brought into communication with each other after termination of vacuum treatment, the degree of vacuum in respective chambers become equalized. Accordingly, it is not necessary to reduce the interior pressure of the preliminary vacuum chamber, which newly receives a material to be treated, to a degree of vacuum required for vacuum treatment. This makes it possible to obtain a predetermined degree of vacuum without increasing the size of the suction device as well as enhance the productivity and reduce the operating cost.

Furthermore, with the above-described apparatus, the mode of operation of the switching valve is switched by the control means whereby the pressure reducing operations in the respective chambers are carried out in a switched manner by continuously operating the suction means, and therefore, the suction means is operated efficiently. Also, the operations of the shutters and transfer means are controlled by the control means, and therefore the material to be treated is subjected to vacuum treatment automatically and efficiently.

Moreover, according to the present invention, there is provided a method in a device having a vacuum treating chamber and a preliminary vacuum chamber adjacent the vacuum treating chamber and capable of being charged with and discharging therefrom material to be treated in a manner that they are switchingly placed in and out of communication with each other, the method comprising the steps of, when a pressure within the preliminary vacuum chamber that is disconnected from the vacuum treating chamber has been reduced to a first degree of vacuum indicative of a low vacuum state, placing the vacuum treating chamber and the preliminary vacuum chamber into mutual communication to let these chambers be of a pressure level of a second degree of vacuum, thereby shifting the material to be treated from the preliminary vacuum chamber to the vacuum treating chamber; subsequently, disconnecting the vacuum treating chamber and preliminary vacuum chamber from each other and subjecting the material to be treated to vacuum treatment in the vacuum treating chamber at a third degree of vacuum indicative of a pressure further reduced lower than the pressure at the second degree of vacuum; after the passage of a predetermined period of time of vacuum treatment, bringing both the chambers into communication with each other to allow a treated material to be shifted from the vacuum treating chamber to the preliminary vacuum chamber; further reducing the pressure of the vacuum treating chamber to a fourth degree of vacuum greater than said third degree of vacuum under a state where both the chambers are disconnected from each other; after discharging the treated material from the preliminary vacuum chamber and charging thereto a new material to be treated, allowing the preliminary vacuum chamber to start being reduced in pressure from atmospheric pressure, and when the preliminary vacuum chamber has assumed said first degree of vacuum, bringing both the chambers into communication with each otherto obtain the second degree of vacuum.

In the present invention, there is further provided a vacuum treating apparatus comprising: a vacuum treating chamber; a preliminary vacuum chamber capable of being charged with and discharged therefrom a material to be treated, the preliminary vacuum chamber being arranged on one side of the vacuum treating chamber; a shutter disposed between the vacuum treating chamber and the preliminary vacuum chamber for opening and closing operation; transfer means disposed to extend between the vacuum treating chamber and the preliminary vacuum chamber, said transfer means being selectively switchable in its moving direction so as to move a material to be treated between the vacuum treating chamber and the preliminary vacuum chamber; suction means connected in common to the vacuum treating chamber and the preliminary vacuum chamber through switching valves; and control means for controlling operations of said shutter, transfer means, suction means and switching valves; said control means being adapted to control said shutter, transfer means, suction means and switching valves such that in a state where a material to be treated has been charged into the preliminary vacuum chamber, a pressure within the vacuum treating chamber is reduced in advance to a degree of vacuum greater than that required for vacuum treatment, and the vacuum treating chamber and the preliminary vacuum chamber are brought into communication with each other in the course of pressure reducing operation in the preliminary vacuum chamber in order to allow the material to be transferred to the vacuum treating chamber.

Owing to the above-described method, when the material to be treated is charged from the preliminary vacuum chamber to the vacuum treating chamber, the vacuum treating chamber has been reduced in pressure, in advance, to the fourth degree of vacuum, and when the preliminary vacuum chamber has assumed the first degree of vacuum, the preliminary vacuum chamber and the vacuum treating chamber are brought into communication with each other to obtain the second degree of vacuum in these chambers. Therefore, it becomes possible to reduce the pressure in the vacuum treating chamber to the third degree of vacuum required for vacuum treatment in a relatively short period of time. In addition, since the preliminary vacuum chamber need not be reduced in pressure to the third degree of vacuum, it becomes possible to shorten the whole treating time.

With the above-described apparatus, the mode of operation of the switching valve is switched by the control means to thereby selectively reduce the pressure in the respective chambers while actuating the suction means continuously, and therefore, it becomes possible to operate the suction means efficiently. In addition, since the operation of the shutter and the transfer means are also controlled by the control means, the material to be treated may be vacuum-treated automatically and efficiently.

Other objects, features and advantages of the present invention will be apparent from the description of the preferred embodiments which will be described in detail in conjunction with the accompanying drawings.

BRIEF DESCRIPTION OF THE DRAWINGS

FIGS. 1 to 3 show one embodiment of the present invention, in which:

FIG. 1 is a schematic view showing the construction of an apparatus adapted for conducting a treatment prior to coating;

FIG. 2 is a schematic view showing the construction of plasma generating means; and FIG. 3 is a graphic representation showing the changes of a degree of vacuum.

FIGS. 4 and 5 show another embodiment of the present invention, in which:

FIG. 4 is a schematic view showing the construction of an apparatus adapted for conducting a treatment prior to coating; and FIG. 5 is a graphic representation showing the changes of a degree of vacuum.

DESCRIPTION OF THE PREFERRED EMBODIMENTS

Figure 1:
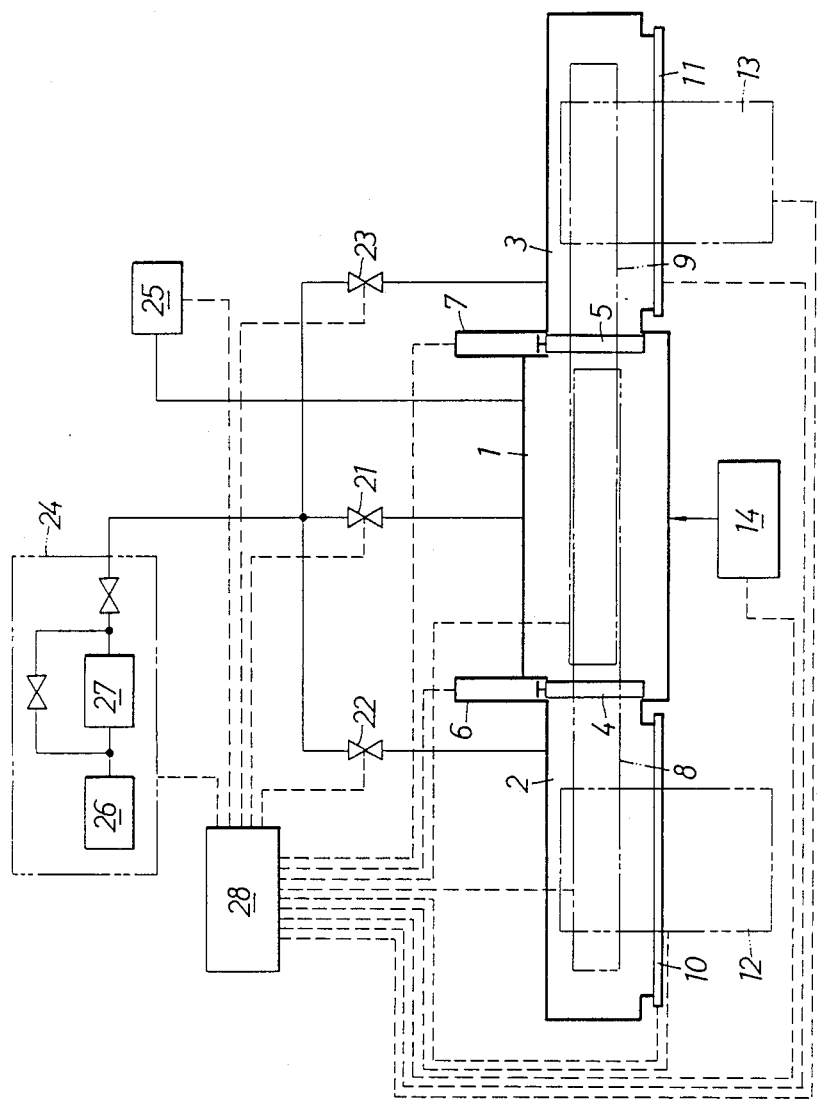

The present invention will be described hereinafter by way of a few embodiments to which the present invention is applied for giving treatment to plastic products prior to coating. Referring first to FIG. 1 showing one embodiment of the present invention, a first preliminary vacuum chamber 2 and a second preliminary vacuum chamber 3 are arranged in a straight line fashion on both sides of a vacuum treating chamber 1, whereby a product of plastic or synthetic resin material which is subjected to a pre-coating treatment as a material to be treated is alternately moved between the vacuum treating chamber 1 and both the preliminary vacuum chambers 2 and 3 for the pre-coating treatment.

Shutters 4, 5 are provided between the vacuum treating chamber 1 and both the preliminary vacuum chambers 2 and 3 to switch the communication and disconnection states therebetween, the shutters 4, 5 being driven to be opened and closed by drive means 6 and 7. Each of the shutters 4, 5 is designed so that when the shutter is closed, sufficient airtightness may be maintained between both sides thereof.

Transfer means 8 and 9 are provided to extend between the first preliminary vacuum chamber 2 and vacuum treating chamber 1 and between the second preliminary vacuum chamber 3 and the vacuum treating chamber 1, respectively, so as to reciprocatingly move a plastic product. Opening and closing doors 10 and 11 are provided at both the preliminary vacuum chambers 2 and 3 for charging and discharging the plastic products, the doors 10 and 11 being likewise designed so that when they are closed, the airtightness of both the preliminary vacuum chambers 2 and 3 may be sufficiently maintained. Further, charging transfer means 12 and discharging transfer means 13 are disposed between the preliminary vacuum chambers 2, 3 and the exterior respectively, for automatically carrying out the charging and discharging of the plastic products.

Figure 2:
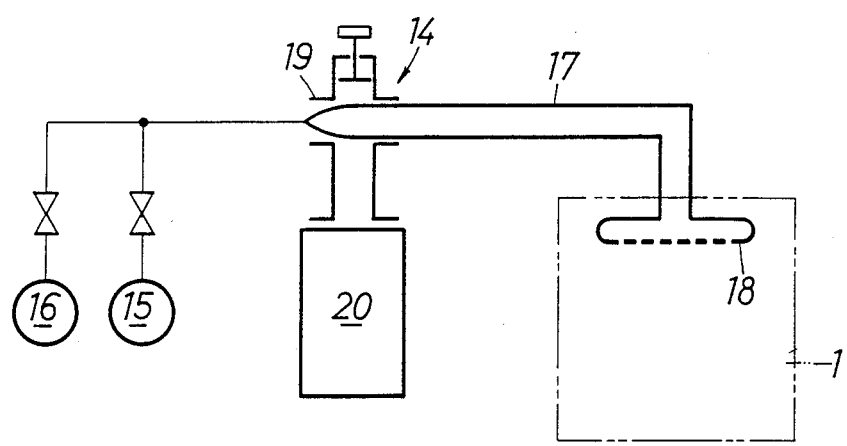

Referring also to FIG. 2, plasma generating means 14 is connected to the vacuum treating chamber 1. The plasma generating means 14 comprises an $O_2$ gas supply source 15, an $N_2$ gas supply source 16, a plasma introducing pipe 17 having one end connected in common to both the supply sources 15 and 16 and the other end extended into the vacuum treating chamber 1, a shower pipe 18 provided on the other end of the plasma introducing pipe 17, a plasma generator 19 provided to cover an intermediate portion of the pipe 17, and a microwave oscillator 20 for supplying a microwave to the plasma generator 19. The plasma generating means 14 is connected to the vacuum treating chamber 1 and is provided in such variable number corresponding to the quantity of treatment.

The vacuum treating chamber 1 and both the preliminary vacuum chambers 2, 3 are connected in common to suction or evacuating means 24 through individual switching valves 21, 22 and 23, and a rotary pump as auxiliary suction or evacuating means 25 is also connected to the vacuum treating chamber 1. The suction means 24 is formed by a combination of a rotary pump 26 and a mechanical booster 27, which can promptly obtain a degree of vacuum up to a degree of 0.1 Torr. That is, the rotary pump 26 requires a relatively short time for starting and can reach the degree of vacuum ranging from $10^{-1}$ to $10^{-2}$ Torr, but, after it has reached approximately 10 Torr, the air exhausting speed lowers. On the other hand, the mechanical booster 27 is able to reach a degree of vacuum of approximately $10^{-3}$ Torr but is slow in operation speed till it reaches approximately 20 Torr. Thus, the rotary pump 26 and the mechanical booster 27 are combined to compensate for the disadvantages belonging to the opposite members, thereby permitting the degree of vacuum up to approximately 0.1 Torr to be achieved swiftly.

The auxiliary suction means 25 is employed to maintain the interior pressure of the vacuum treating chamber 1 substantially constant, and when the plasma treatment is conducted within the vacuum treating chamber 1, the interior of the vacuum treating chamber 1 is held at a pressure of 0.8 to 1 Torr.

The operations of the shutters 4, 5, transfer means 8, 9, 12, 13, doors 10, 11, plasma generating means 14, switching valves 21, 22, 23, suction means 24 and auxiliary suction means 25 are controlled by the control means 28 whereby the pre-coating treatment of a plastic product is automatically carried out.

Figure 3:
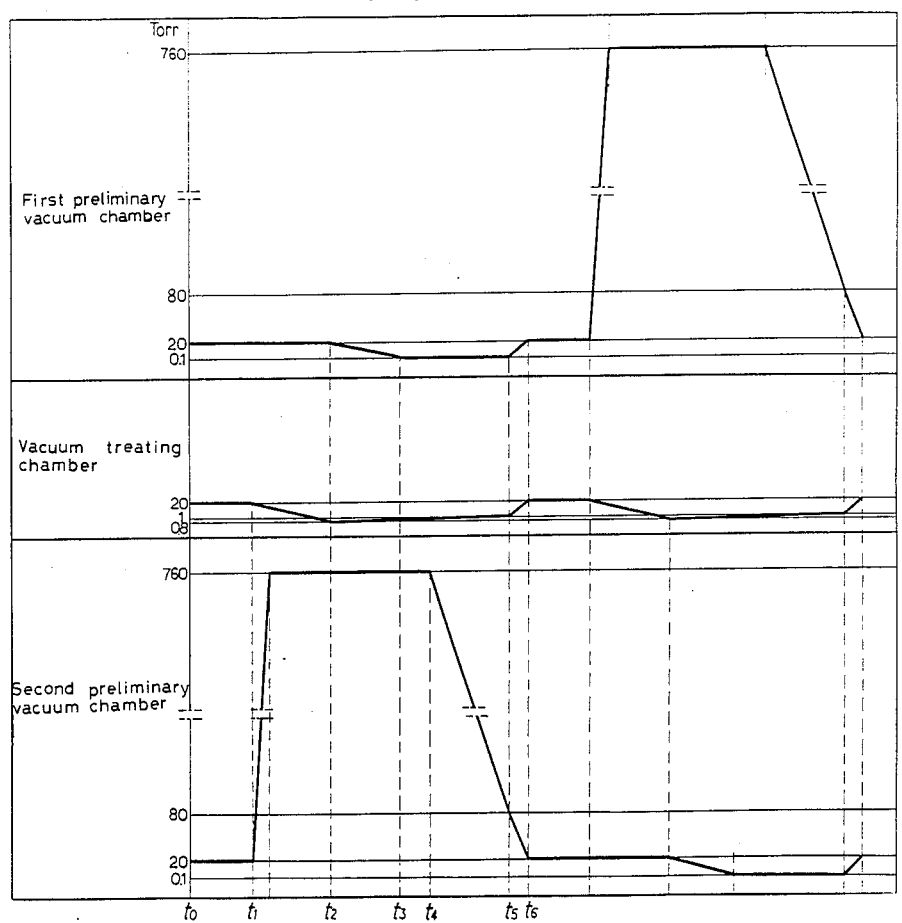

Next, the operation of the above-described embodiment will be described with reference to FIG. 3. First, assume that at time $t_0$, a plastic product has been charged into the first preliminary vacuum chamber 2 and another plastic product which has already been subjected to plasma treatment is present in the vacuum treating chamber 1. When in this condition, with the doors 10, 11 being held closed, the vacuum treating chamber 1 and both the preliminary vacuum chambers 2, 3 are brought into communication with each other, the degree of vacuum of the respective chambers 1, 2 and 3 becomes 20 Torr. Then the shutters 4, 5 are opened to move the plastic product in the first preliminary vacuum chamber 2 to vacuum treating chamber 1 and move the plastic product already subjected to plasma treatment in the vacuum treating chamber 1 to the second preliminary vacuum chamber 2 by time $t_1$.

At the time $t_1$ when transfer of the plastic products has been completed, the shutters 4, 5 are closed, and the door 11 of the second preliminary vacuum chamber is opened. Thereby the interior of the second preliminary vacuum chamber 3 rapidly assumes the atmospheric pressure (760 Torr) and the discharge of the plastic product already subjected to plasma treatment from the chamber 3 and the charge of a new plastic product to be plasma-treated into the chamber 3 are conducted, after which the door 11 is closed.

On the other hand, the pressure reducing operation is started in the vacuum treating chamber 1 by the suction means 24 at time $t_1$, and when the internal pressure reaches a degree of vacuum of 0.8 Torr at time $t_2$, the plasma generating means 14 is actuated and the plastic product in the chamber 1 is subjected to plasma treatment. Also at time $t_2$, the pressure reducing operation by the suction means 24 is switched and acts on the first preliminary vacuum chamber 2 while the interior of the vacuum treating chamber 1 is held at 0.8 to 1.0 Torr by the auxiliary aspirator means 25.

The pressure reduction in the first preliminary vacuum chamber 2 by the suction means 24 is continued until time $t_3$ at which the degree of vacuum in the chamber 1 reaches 0.1 Torr. During this operation the plasma treatment is continuously applied to the product in the vacuum treating chamber.

At time $t_4$ which is halfway of the progress of the plasma treatment, only the rotary pump 26 of the suction means 24 is used to obtain a pressure reduction in the second preliminary vacuum chamber 3 and this pressure reducing operation is continued by time $t_5$ when the plasma treatment in the vacuum treating chamber 1 terminates.

At time $t_5$, the degree of vacuum of the second preliminary vacuum chamber 3 is, for example, at a level of approximately 80 Torr and at this time $t_5$ the vacuum treating chamber 1 and both the preliminary vacuum chambers 2, 3 are placed in communication. At that time, the degree of vacuum of the vacuum treating chamber 1 is 1 Torr and that of the first preliminary vacuum chamber 2 is 0.1 Torr. Therefore, the whole degree of vacuum throughout the chambers 1, 2 and 3 becomes approximately 20 Torr at time $t_6$.

The operations conducted from time $t_o$ to $t_6$ constitute one operation cycle, which is 38 seconds for example. Thereafter, the operations are carried out in the vacuum treating chamber 1 and the first and second preliminary vacuum chambers 2, 3 in a manner reverse to what has been described above. Repeating of such operation cycles allows plastic products to be subjected to plasma treatment sequentially.

Thus, it is arranged according to the invention that one preliminary vacuum chamber which is waiting in vacant state for an already treated plastic product has been further reduced to a degree of vacuum higher than the degree of vacuum required for vacuum treatment while the treatment is being carried out to said product in the vacuum treating chamber 1. Accordingly, when the plastic product is moved, the respective chambers 1, 2 and 3 are brought into communication with each other to have a vacuum level of approximately 20 Torr. Thus, the time (time $t_o$ to $t_2$) consumed prior to starting of a plasma treatment can be shortened. Moreover, by merely continuously actuating the suction means 24, a high degree of vacuum is achieved even if said means is not large-sized, thus contributing to enhancement of productivity and reduction in operating cost.

Figure 4:
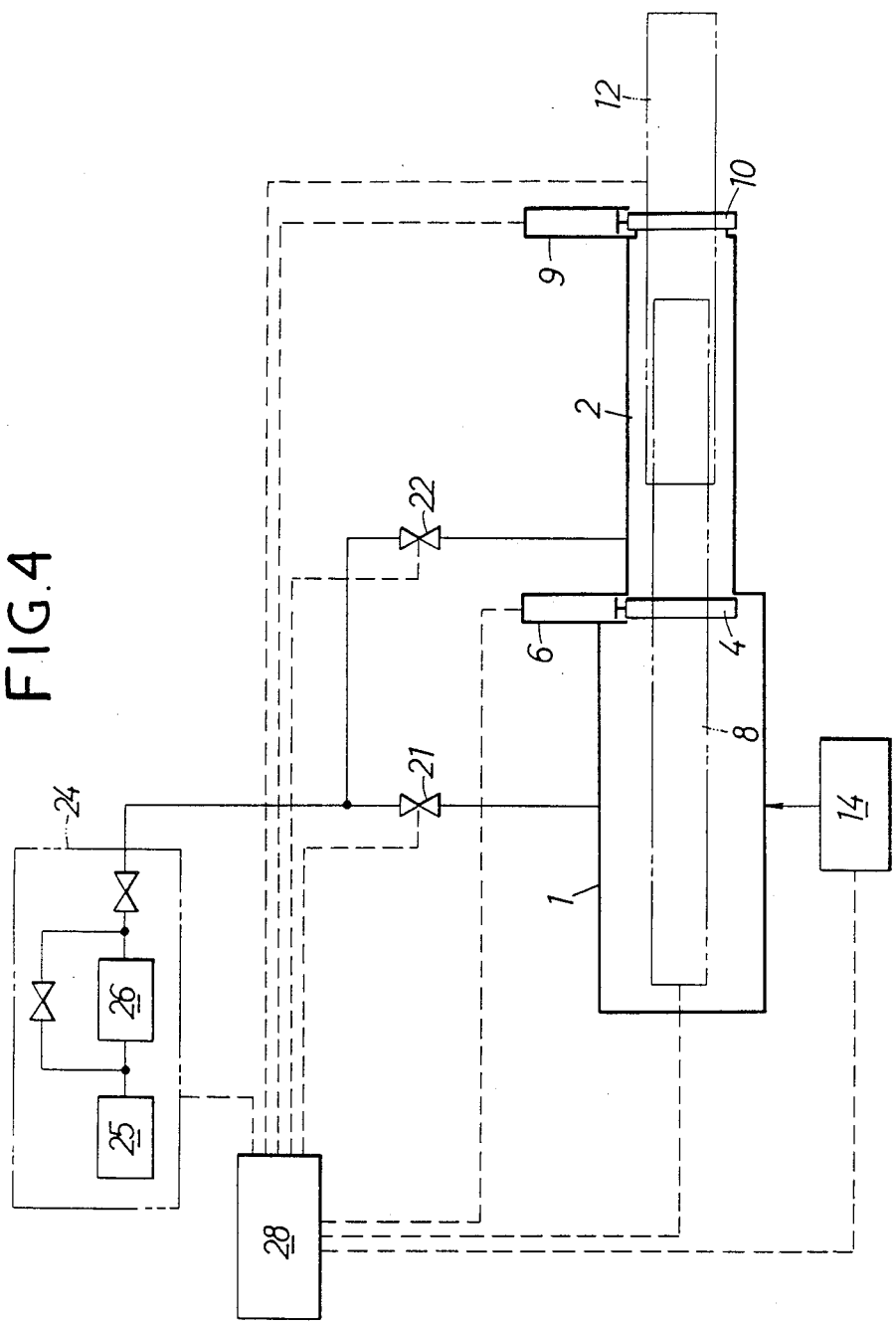

FIG. 4 shows another embodiment of the present invention, in which parts corresponding to those of the previously mentioned embodiment are indicated by the same reference numerals.

A preliminary vacuum chamber 2 is arranged in a straight line fashion on one side of a vacuum treating chamber 1. A plastic product to be applied with prior treatment as a material to be treated is once charged into the preliminary vacuum chamber 2 and thereafter moved to the vacuum treating chamber 1. The plastic product applied with pre-coating treatment in the vacuum treating chamber 1 is discharged after having been moved to the preliminary vacuum chamber 2.

A shutter 4 is provided between the vacuum treating chamber 1 and the preliminary vacuum chamber 2 to switch communication and disconnection therebetween, the shutter 4 being driven to be opened and closed by an opening and closing drive means 6. Moreover, the shutter 4 is designed so as to be able to maintain sufficient airtightness between both sides thereof.

Transfer means 8 is provided to extend between the vacuum treating chamber 1 and the preliminary vacuum chamber 2 in order to move a plastic product therebetween, the transfer means 8 capable of selectively switching the moving direction of the product. A door 10 driven to be opened and closed by opening and closing drive means 29 is provided at that end of the preliminary vacuum chamber 2 which is on the side opposite to the vacuum treating chamber 1 to allow the charge and discharge of a plastic product. The door 10 is likewise designed so as to sufficiently maintain the airtightness of the preliminary vacuum chamber 2 against the outside when it is closed. Charging and discharging transfer means 12 is provided to extend between the preliminary vacuum chamber 2 and the exterior to automatically charge and discharge plastic products.

The operations of the aforesaid shutter 4, transfer means 8, 12, door 10, plasma generating means 14, switching valves 21, 22 and suction means 24 are controlled by control means 28 whereby the pre-coating treatment of plastic products is carried out automatically.

Next, the operation of the above-described embodiment will be explained with reference to FIG. 5. FIG. 5 shows the changes of the degree of vacuum of the vacuum treating chamber 1 and the preliminary vacuum chamber 2 along with passage of time, in which curves A and B correspond to the preliminary vacuum chamber 2 and vacuum treating chamber 1, respectively. The axis of ordinate representative of a degree of vacuum is indicated by a logarithmic scale.

First, at time $t_o'$, the preliminary vacuum chamber 2 and the vacuum treating chamber 1 are disconnected from each other, and a plastic product to be applied with a pre-coating treatment has been charged into the preliminary vacuum chamber 2, and the door 10 is held closed. At that time, the vacuum treating chamber 1 is reduced in pressure up to a fourth degree of vacuum $P_4$.

The preliminary vacuum chamber 2 which is currently at atmospheric pressure is reduced in pressure by actuating only the rotary pump 26 of the suction means 24, and when the degree of vacuum of the preliminary vacuum chamber 2 reaches the level $P_1$ at time $t_1'$, the vacuum treating chamber 1 and the preliminary vacuum chamber 2 are brought into communication with each other. Thereby the vacuum treating chamber 1 and the preliminary vacuum chamber 2 assume a second degree of vacuum $P_2$. In this state with the shutter 4 being opened, the plastic product in the preliminary vacuum chamber 2 is transferred to the vacuum treating chamber 1, and at $t_2'$, the shutter 4 is closed.

From time $t_2'$, the suction means 24 is actuated to reduce the internal pressure of vacuum treating chamber 1 in order to achieve the degree of vacuum required for the treatment prior to coating, that is, a third degree of vacuum $P_3$, and after the degree of vacuum $P_3$ is achieved at time $t_3'$, the surface of the plastic product is subjected to plasma treatment while maintaining the third degree of vacuum $P_3$ in the chamber 1 till time $t_4'$. terminates at time $t_4'$, the vacuum treating chamber 1 and the preliminary vacuum chamber 2 are brought into communication with each other, and when the degree of vacuum of both the chambers 1 and 2 assumes p*, the already treated plastic product is moved to the preliminary vacuum chamber 2 and the shutter 4 is closed at time $t_5'$.

After the vacuum treating chamber 1 and the preliminary vacuum chamber 2 are disconnected from each other, the pressure reducing operation is initiated by the suction means 24 in the vacuum treating chamber 1 to reduce the pressure to the fourth degree of vacuum $P_4$ which is higher than the third degree of vacuum $P_3$. On the other hand, the preliminary vacuum chamber 2 is made open to the atmosphere while opening the door 10 so that the already treated plastic product is discharged outside and a new plastic product is charged thereinto, after which the door 10 is closed at time $t_6'$.

In this manner, one operation cycle is terminated and by carrying out said cycle repeatedly plastic products are subjected to pre-coating treatment sequentially.

Assume here that the volume $V_1$ of the vacuum treating chamber 1 is 1000 l, the volume $V_2$ of the preliminary vacuum chamber 2 is 500 l, the suction volume Vm of the mechanical booster 27 is 40000 l/min, the suction volume Vr of the rotary pump 26 is 7500 l/min, the first degree of vacuum $P_1$ is 60 Torr, the second degree of vacuum $P_2$ is 20 Torr, the third degree of vacuum $P_3$ is 1 Torr, the fourth degree of vacuum $P_4$ is 0.1 Torr, and the time $T_4$ from $t_3'$ to $t_4'$, namely, the time of pre-coating treatment, is 20 seconds, then the aforementioned degree of vacuum $P^*$ is 10 Torr, and time for one operation cycle is about 63 seconds for example.

That is, time $T_1$ from $t_0'$ to $t_1'$ is about 15 seconds for example, time $T_2$ from $t_1'$ to $t_2'$ is about 5 seconds for example, time $T_3$ from $t_2'$ to $t_3'$ is about 8 seconds for example, $T_5$ from $t_4'$ to $t_5'$ is 5 seconds, and time $T_6$ from $t_5'$ to $t_6'$ is about 10 seconds for example, totalling to about 63 seconds.

Time for one operational cycle when the aforementioned conditions are varied is given as shown in Table I below.

TABLE 1

|  | 1 | 2 | 3 | 4 |
|---|---|---|---|---|
| $V_1$ (l) | 1000 | 1000 | 1000 | 1000 |
| $V_2$ (l) | 500 | 1000 | 500 | 500 |
| Vr (l/min) | 7500 | 7500 | 10500 | 7500 |
| Vm (l/min) | 40000 | 40000 | 40000 | 40000 |
| $P_1$ (Torr) | 60 | 40 | 60 | 60 |
| $P_2$ (Torr) | 20 | 20 | 20 | 20 |
| $P_3$ (Torr) | 1 | 1 | 1 | 0.5 |
| $P_4$ (Torr) | 0.1 | 0.1 | 0.1 | 0.1 |
| One cycle time (second) | 63 | 82 | 58 | 64 |

On the other hand, where when the plastic product is moved from the preliminary vacuum chamber 2 to the vacuum treating chamber 1, both the chambers 1 and 2 are reduced to the same degree of vacuum instead of bringing these chambers into communication with each other (namely, $P_1=P_2$), one operational cycle time is given in Table 2 below.

TABLE 2

|  | 1 | 2 | 3 |
|---|---|---|---|
| $V_1$ (l) | 1000 | 1000 | 1000 |
| $V_2$ (l) | 500 | 500 | 1000 |
| Vr (l/min) | 7500 | 10500 | 10500 |
| Vm (l/min) | 40000 | 40000 | 40000 |
| $P_1$ (Torr) | 20 | 20 | 20 |
| $P_2$ (Torr) | 20 | 20 | 20 |
| $P_3$ (Torr) | 1 | 1 | 1 |
| One cycle time (second) | 70 | 64 | 90 |

It is to be noted that as will be apparent from Tables 1 and 2, if the volumes $V_1$, $V_2$ of the vacuum treating chamber 1 and preliminary vacuum chamber 2, the suction volumes Vm, Vr of the mechanical booster 27 and rotary pump 26 and the treating time are the same, one cycle time can be shortened by reducing the pressure of the vacuum treating chamber 1 to such a degree of vacuum as is higher than that required for vacuum treatment at the time of movement of the material to be treated and by bringing both the chambers 1 and 2 into communication with each other in the course of pressure reducing operation of the preliminary vacuum chamber 2.

While in the foregoing, the embodiments have been described for the case wherein the present invention is applied for the pre-coating treatment of a plastic product, it should be noted that the present invention may be widely embodied in any other appropriate mode as the method and apparatus for vacuum treatment.

What is claimed is:

1. A vacuum treating apparatus, comprising:
   a vacuum treating chamber;
   a pair of preliminary vacuum chambers capable of charging and discharging materials to be treated and being arranged on both sides, respectively, of the vacuum treating chamber;
   a pair of shutters disposed between the vacuum treating chamber and both the preliminary vacuum chambers so as to switch communication and disconnection between the vacuum treating chamber and both the preliminary vacuum chambers;
   a pair of transfer means disposed between both the preliminary vacuum chambers and the vacuum treating chamber so as to alternately move the materials to be treated from one and then the other of said preliminary vacuum chambers into the vacuum treating chamber;
   a suction means connected in common to the vacuum treating chamber and both the preliminary vacuum chamber through switching valves; and
   control means for controlling operations of said shutters, transfer means, suction means and switching valves; said control means having functions of controlling said shutters, transfer means, suction means and switching valves such that when the material to be treated is under vacuum treatment within the vacuum treating chamber, one of the preliminary vacuum chambers which waits in a vacant state for the material under treatment is reduced in pressure to a level lower than a degree of vacuum required for vacuum treatment whereas the other preliminary vacuum chamber which receives a new material to be treated is reduced its pressure from atmospheric pressure, and after termination of the vacuum treatment, the vacuum treating chamber and both the preliminary vacuum chambers are brought into communication with each other for conducting shifting of materials to be treated therebetween.

2. The apparatus as set forth in claim 1 wherein plasma generating means is connected to said vacuum treating chamber.

3. The apparatus as set forth in claim 1 or 2 wherein said suction means is composed of a combination of a rotary pump and a mechanical booster.

4. A vacuum treating apparatus, comprising:
   a vacuum treating chamber;
   a preliminary vacuum chamber for charging and discharging a material to be treated and being disposed on one side of said vacuum treating chamber;
   a shutter disposed between said vacuum treating chamber and said preliminary vacuum chamber for opening and closing operation;

transfer means disposed between and over said vacuum treating chamber and said preliminary vacuum chamber, said transfer means being selectively switchable in a moving direction thereof so as to move a material to be treated between said vacuum treating chamber and said preliminary vacuum chamber;

a suction means connected in common with vacuum treating chamber and said preliminary vacuum chamber through switching valves; and control means for controlling operations of said shutter, transfer means, suction means and switching valves; said control means having functions of controlling said shutter, transfer means, suction means and switching valves such that in a state where a material to be treated has been charged into said preliminary vacuum chamber, a pressure with said vacuum treating chamber is reduced, in advance, to a level with a degree of vacuum greater than a degree of vacuum required for vacuum treatment, and said vacuum treating chamber and said preliminary vacuum chamber are brought into communication with each other in the course of pressure reduction in said preliminary vacuum chamber to move the material to be treated to said vacuum treating chamber.

* * * * *